(12) United States Patent
Zhang et al.

(10) Patent No.: US 6,919,101 B2
(45) Date of Patent: Jul. 19, 2005

(54) METHOD TO DEPOSIT AN IMPERMEABLE FILM ON POROUS LOW-K DIELECTRIC FILM

(75) Inventors: Zhihong Zhang, Fremont, CA (US); Tai Dung Nguyen, Fremont, CA (US); Tue Nguyen, Fremont, CA (US)

(73) Assignee: Tegal Corporation, Petaluma, CA (US)

( * ) Notice: Subject to any disclaimer, the term of this patent is extended or adjusted under 35 U.S.C. 154(b) by 0 days.

(21) Appl. No.: 10/360,133

(22) Filed: Feb. 4, 2003

(65) Prior Publication Data

US 2004/0149686 A1 Aug. 5, 2004

(51) Int. Cl.$^7$ ............................................. C23C 16/40
(52) U.S. Cl. ........................... 427/255.29; 427/255.37; 427/255.394; 427/372.2; 427/397.7; 438/763; 438/787; 204/192.23
(58) Field of Search ....................... 427/255.29, 255.37, 427/255.394, 255.5, 372.2, 397.7; 438/763, 787, 791; 204/192.23

(56) References Cited

U.S. PATENT DOCUMENTS 6,171,945 B1 * 1/2001 Mandal et al. .............. 438/622
6,541,367 B1 * 4/2003 Mandal ...................... 438/622
6,707,544 B1 * 3/2004 Hunter et al. ............ 356/237.5

* cited by examiner

Primary Examiner—Bret Chen
(74) Attorney, Agent, or Firm—Fliesler Meyer LLP

(57) ABSTRACT

A method for improving the adhesion of an impermeable film on a porous low-k dielectric film in an interconnect structure is disclosed. The method provides an in-situ annealing step before the deposition of the impermeable film to release the volatile trapped molecules such as water, alcohol, HCl, and HF vapor, inside the pores of the porous low-k dielectric film. The method also provides an in-situ deposition step of the impermeable film right after the deposition of the porous low dielectric film without exposure to an atmosphere containing trappable molecules. The method further provides an in-situ deposition step of the impermeable film right after the removal a portion of the porous low-k dielectric film without exposure to an atmosphere containing trappable molecules. By the removal of all trapped molecules inside the porous low-k dielectric film, the adhesion between the deposited impermeable film and the low-k dielectric film is improved. This method is applicable to many porous low-k dielectric films such as porous hydrosilsesquioxane or porous methyl silsesquioxane, porous silica structures such as aerogel, low temperature deposited silicon carbon films, low temperature deposited Si—O—C films and methyl doped porous silica.

15 Claims, 6 Drawing Sheets

METHOD TO DEPOSIT AN IMPERMEABLE FILM ON POROUS LOW-K DIELECTRIC FILM

FIELD OF THE INVENTION

This invention relates generally to integrated circuit processes and fabrication, and more particularly, to a method to deposit an impermeable film on a porous low-k dielectric film.

BACKGROUND OF THE INVENTION

The demand for progressively smaller, less expensive, and more powerful electronic products creates a need for smaller geometry integrated circuits (ICs) and larger substrates. It also creates a demand for a denser packaging of circuits onto IC substrates. The desire for smaller geometry IC circuits requires that the dimensions of interconnections between the components and the dielectric layers be as small as possible. Therefore, recent research continues to focus on the use of low resistance materials (e.g., copper) in conjunction with insulating materials with low dielectric constant (k) between the metal lines.

The use of low resistance materials is needed because of the reduction in the cross sectional area of via interconnects and connecting lines. The conductivity of interconnects is reduced as the surface area of interconnects is reduced, and the resulting increase in interconnect resistively has become an obstacle in IC design. Conductors having high resistivity create conduction paths with high impedance and large propagation delays. These problems result in unreliable signal timing, unreliable voltage levels, and lengthy signal delays between components in the IC. Propagation discontinuities also result from intersecting conduction surfaces that are poorly connected and from the joining of conductors having highly different resistivity characteristics.

There is a need for low resistivity interconnects and vias that have the ability to withstand volatile process environments. Aluminum and tungsten metals are often used in the production of integrated circuits for making interconnections or vias between electrically active areas. These metals have been used for a long time in the production environment because the processing technologies for these metals were available. Much experience and expertise with these metals have been acquired.

Copper is a natural choice to replace aluminum in the effort to reduce the size of lines and vias in an electrical circuit. The conductivity of copper is approximately twice that of aluminum and over three times that of tungsten. As a result, the same current can be carried through a copper line having half the width of an aluminum line.

However, there have been problems associated with the use of copper in IC processing. Copper poisons the active area of silicon devices, creating unpredictable responses. Copper also diffuses easily through many materials used in IC processes and, therefore, care must be taken to keep copper from migrating.

Various means have been suggested to deal with the problem of copper diffusion into integrated circuit materials. Several materials, including metals and metal alloys, have been suggested for use as barriers to prevent copper diffusion. The typical conductive diffusion barrier materials are TiN, TaN and WN. Addition of silicon into these materials to create TiSiN, TaSiN, and WsiN, respectively, could offer improvements in the diffusion barrier properties. Silicon nitride has been the best non-conductive diffusion barrier material so far.

Diffusion barrier materials could be deposited by the chemical vapor deposition technique. For example, in the case of TiN CVD deposition, a precursor that contains Ti and optionally nitrogen is used. The precursor decomposes at the selected surfaces, and the decomposed elements react together to form a TiN layer on the selected surfaces. Reaction by-products (i.e., products produced by the precursor decomposition and the following reactions that do not deposited on the selected surfaces) are often volatile and are exhausted away.

Of equal importance with the use of low resistance materials in interconnecting lines is the introduction of low dielectric constant materials (low-k dielectrics) for insulating between the interconnecting lines. Low k dielectrics are insulating dielectric materials that exhibit dielectric constants that are less than those of conventional IC dielectric materials such as silicon dioxide (k value of about 4), silicon nitride (k value of about 7), and silicon oxynitride (k value of about between 4 and 7).

Various low-k dielectrics have been introduced including fluorine doped silicon dioxide (k value of about 3–3.6), carbon doped silicon dioxide (k value of about 2.5–3.3), fluorinate carbon (k value of about 2.5–3.6), and organic materials such as parylene (k value of about 3.8–3.6) and polyimide (k value of about 3–3.7). Some of these materials have been successfully incorporated into the IC fabrication processes, but others have not been because of various difficulties involved with the integration. The low k dielectrics can be deposited by CVD or spin-on techniques.

Further research is focusing on porous low-k dielectrics because of their potential lower dielectric constants (2–3). Examples of porous low dielectric materials are porous hydrosilsesquioxane or porous methyl silsesquioxane, porous silica structures such as aerogel, low temperature deposited silicon carbon films, low temperature deposited Si—O—C films, and methyl doped porous silica.

The use of porous low-k dielectrics presents significant integration problems such as low mechanical strength, poor dimensional stability, poor temperature stability, high moisture absorption, permeation, poor adhesion, large thermal expansion coefficient, and unstable stress level.

Of the various problems associated with porous low-k dielectrics, the trapping of small molecules in porous low-k dielectrics is one that is recognized in IC processes. U.S. Pat. No. 6,417,118 to Hu et al. discloses a method to prevent further absorption of moisture into a porous low-k dielectric film by treating the porous film with a reactive solution to convert the porous low-k dielectric surface from the hydrophillic state (attracting moisture) to the hydrophobic state (repelling moisture) after all the trapped moisture was removed by low temperature annealing. U.S. Pat. No. 6,486,061 to Xia et al. discloses a method for providing a dielectric film having enhanced adhesion and stability that uses post deposition treatment that densifies the film in a reducing environment such as $NH_3$ or $H_2$. By post deposition annealing in $NH_3$ or $H_2$, Xia et al. found that the dielectric film becomes more moisture resistant and retains a low value of dielectric constant even when exposed to the ambient for a week.

The integration of porous low-k dielectrics remains a problem. Even with treatments of low-k dielectric films, the adhesion of the subsequent film, such as a diffusion barrier film for copper interconnect, remains problematic. Since the subsequently deposited films are often impermeable to the trapped molecules such as moisture, alcohol vapor, HCl vapor, and HF vapor, the release of these trapped molecules can cause delamination that leads to device failure.

SUMMARY OF THE INVENTION

Accordingly, a method of improving the adhesion of a subsequently deposited impermeable film onto a porous low-k dielectric film is provided.

The disclosed method basically ensures that the porous low-k dielectric film will not be exposed to an atmosphere containing trappable molecules such as moisture before depositing a subsequent impermeable film such as a conductive diffusion barrier (TiN, TiSiN, TaN, TaSiN, $WN_x$, WSiN) or a dielectric diffusion barrier (SiC, $Si_3N_4$).

The prior art discloses various methods of treating the porous low-k dielectric film to improve the amount of moisture absorption. But our research indicates that these methods can only reduce the amount of moisture absorption, but can not eliminate it. Xia et al. discloses that their treatment of annealing in a reducing environment is effective in increasing the moisture resistant property and in retaining the dielectric constant value after exposing to air for 1 week but is silent on the adhesion of subsequent impermeable film such as a diffusion barrier. Our research indicates that this treatment is not at all effective in improving the adhesion of TiN on the porous low-k dielectric film after exposing to air even for a few hours. After extensive evaluations of various treatments, the only effective treatment we found to improve the adhesion of the subsequent impermeable film such as a diffusion barrier to the porous low-k dielectric film is by not exposing the porous low-k dielectric film to a moisture containing ambient. Moisture will be trapped inside the pores when a porous low-k dielectric film is exposed to air, and without the removal of the trapped moisture, the adhesion of the subsequently deposited impermeable film to the porous low-k dielectric film will be gradually degraded as a result of the release of the trapped moisture.

In the case that the porous low-k dielectric film already contains moisture, the method provides additional steps of removing the moisture trapped in the pores of low-k dielectric films before in-situ depositing the impermeable film.

In the first preferred embodiment, the method comprises two steps:

a. annealing the porous low k dielectric film to remove the volatile molecules trapped inside the pores of porous low-k dielectric films; and b. depositing an impermeable film onto the porous low-k dielectric films without exposing the porous low-k dielectric film to an atmosphere containing trappable molecules.

The first embodiment addresses the situation where the porous low-k dielectric film has been exposed to air and therefore has much moisture trapped inside the pores. To successfully deposit an adherence impermeable film onto the porous low-k dielectric film, the moisture needs to be removed and the impermeable film is deposited without any exposure of the porous low-k dielectric films to an atmosphere containing trappable molecules.

The most common volatile molecules trapped inside the pores of porous low-k dielectric film are moisture. Other volatile molecules are alcohol, HCl, or HF. The volatile molecules are the molecules that are in their gaseous state at room temperature or higher temperatures. The volatile molecules can be organic or inorganic materials The anneal temperature can be between 50° C. to 500° C. Higher temperatures can drive out moisture in a shorter time, but the higher temperature can damage the porous low-k dielectric films. The anneal time can be between 10 seconds to 2 hours, depending on the anneal temperature and the state of the porous low-k dielectric films. A resistive or a radiative heater can be used for the anneal process. The anneal process can be done in an inert gas ambient such as helium, argon, or nitrogen. The anneal process can also be done in a reactive ambient such as $NH_3$ or hydrogen. The anneal process can also be done in a sub-atmospheric pressure ambient, typically in a pressure of a few Torr or a few milliTorr.

The anneal step and the deposition step can be processed in the same chamber or in different chambers. In the case of different chambers, the method provides for an additional step of transferring the workpiece containing the porous low-k dielectric film from the anneal chamber to the deposition chamber. The transfer is done in an ambient not containing any trappable molecules, such as an inert gas ambient (helium, argon, or nitrogen), or a reactive ambient ($NH_3$ or hydrogen), or sub-atmospheric pressure ambient, typically in a pressure of a few Torr or a few milliTorr. There can be a transfer chamber to temporarily house the work piece for the transfer. The anneal chamber or the deposition chamber can be a single work piece processing chamber, or a multiple work piece processing chamber. The anneal chamber and the deposition chamber can both be a single work piece processing chamber, or can both be a multiple work piece processing chamber, or can be any combination. The choice of chamber can in part be dependent on the desired throughput. If the anneal step is much longer than the deposition step, it is advantageous to use a multiple work piece annealing chamber than to use a single work piece deposition chamber.

The porous low-k dielectric film can be porous hydrosilsesquioxane (porous HSQ) or porous methyl silsesquioxane (porous MSQ), porous silica structures such as aerogel, low temperature deposited silicon carbon films, low temperature deposited Si—O—C films, and methyl doped porous silica. The porous low-k dielectric films can have a passivation layer on top of the porous low-k dielectric films. The impermeable film can be TiN, TaN, $WN_x$, TiSiN, TaSiN, WSiN, $SiO_2$, $Si_3N_4$, silicon carbide, metal films such as copper, tungsten, aluminum, or a Si film such as polysilicon, and amorphous silicon. The impermeable film can be deposited by CVD (chemical vapor deposition) technique, NLD (nanolayer deposition) technique, ALD (atomic layer deposition) technique, or sputtering technique.

In the second preferred embodiment, the method comprises two steps:

a. depositing the porous low-k dielectric films; and b. depositing an impermeable film onto the porous low-k dielectric films without exposing the porous low-k dielectric film to an atmosphere containing trappable molecules.

The second embodiment addresses the situation where the porous low-k dielectric film has not been exposed to the air ambient and therefore has no moisture trapped inside the porous low-k dielectric film. To successfully deposit an adherence impermeable film onto the porous low-k dielectric film, the impermeable film is deposited without any exposure of the porous low-k dielectric film to an atmosphere containing trappable molecules.

The porous low-k dielectric film can be deposited by spin-on technique or CVD technique. The deposition technique can comprise the actual deposition step plus any other steps necessary, such as a film curing step, to ensure a useable porous low-k dielectric film. The method can comprise a further step, after the deposition of the porous low-k dielectric film, to deposit a passivation layer on top of the porous low-k dielectric film.

In the third preferred embodiment, the method comprises two steps:

a. removing a portion of the porous low-k dielectric film; and b. depositing an impermeable film onto the porous low k dielectric film without exposing the porous low-k dielectric film to an atmosphere containing trappable molecules.

The third embodiment addresses the situation where the porous low dielectric film has not been exposed to the air ambient, or has been annealed to remove all moisture, and therefore has no moisture trapped inside the porous low k dielectric film. However, before the deposition of the impermeable film such as a diffusion barrier layer, the porous low-k dielectric film will need to undergo a patterning step. The patterning step will remove a select portion of the porous low-k dielectric film. The removal of a selected portion of the porous low dielectric film will expose the porous low dielectric film even with a passivation layer. To successfully deposit an adherence impermeable film onto the porous low k dielectric film, the impermeable film is deposited without any exposure of the porous low-k dielectric film to an atmosphere containing trappable molecules after the removal of a portion of the porous low-k dielectric film.

The porous low-k dielectric film can have a passivation layer after deposition to protect the top surface. The removal step can be a wet etch step or a plasma enhanced dry etch step. The method can further comprise an additional step in between these two steps. The addition step can be a cleaning step to clean the porous low-k dielectric film and to prepare the porous low-k dielectric film before the deposition of the impermeable film. The additional step can be a photoresist stripping step in the case the porous low-k dielectric film has underwent a photolithography step of patterning which uses photoresist as a method of patterning. The additional step can be an anneal step to drive out all possible moisture or any trapped molecules inside the pore of porous low-k dielectric film before the impermeable film deposition step.

DETAIL DESCRIPTION OF THE PREFERRED EMBODIMENT

Figure 1:
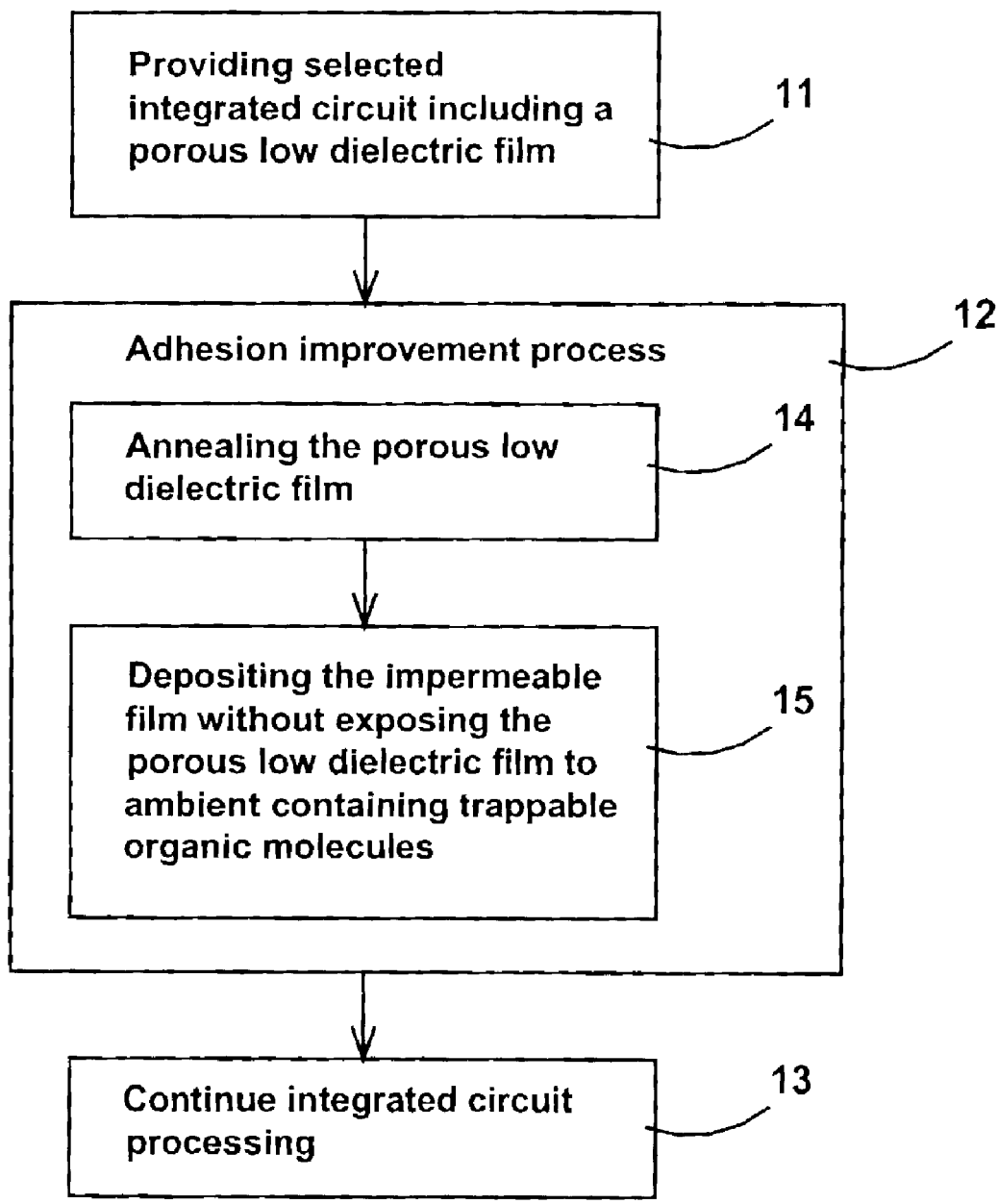
FIG. 1 is a flowchart showing the steps in the first embodiment of the method of improving the adhesion of an impermeable film onto a porous low dielectric film in an integrated circuit processing.

FIG. 1 is a flowchart showing the steps in the first embodiment of the method of improving the adhesion of an impermeable film onto a porous low dielectric film in an integrated circuit processing. Step 11 selects an integrated circuit that includes a porous low-k dielectric film. The porous low-k dielectric film has been exposed to an atmosphere containing trappable organic molecules such as the air ambient containing moisture. Step 12 shows the current invention adhesion improvement process comprising two steps: step 14 and step 15. Step 14 provides the annealing process to remove all trappable organic molecules inside the porous low-k dielectric film. Then step 15 provides the deposition of the impermeable film on top of the porous low dielectric film without exposing the porous low-k dielectric film to an ambient containing trappable organic molecules. Step 13 provides the rest of the integrated circuit processing such as interconnect and passivation. In order not to expose the porous low-k dielectric film to an ambient containing trappable organic molecules, the anneal step 14 and the deposition step 15 can be processed in the same process chamber, or in a cluster system. A cluster system can have four to six process chambers connected to a transfer chamber with a robotic system capable of transferring the wafers from one process chamber to another process chamber. The process chambers and the transfer chamber are typically under vacuum with a pressure of milliTorr or microTorr. The chambers in the cluster system are well maintained to ensure minimum amount of moisture and organic molecules.

Figure 2:
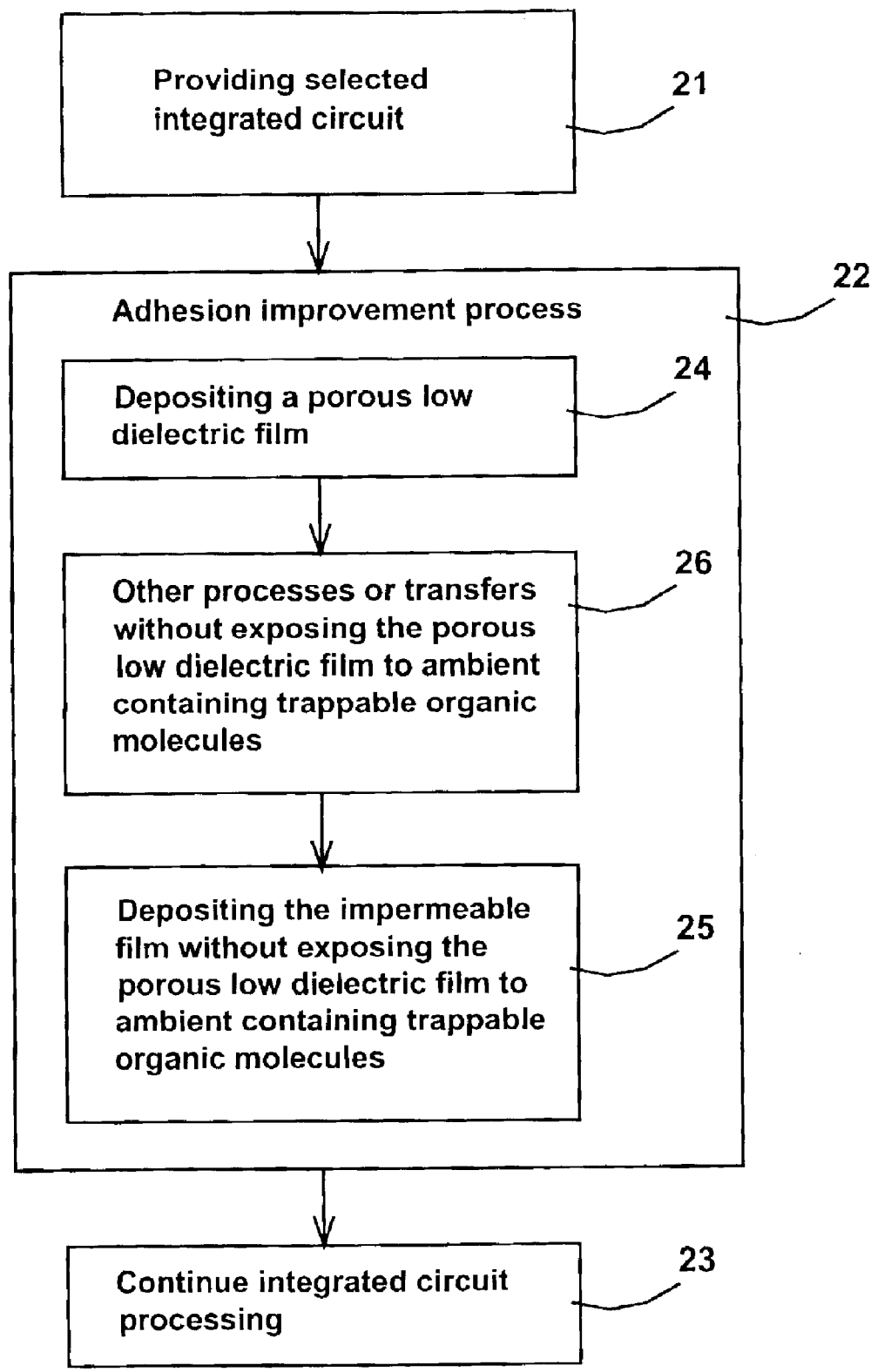
FIG. 2 is a flowchart showing the steps in the second embodiment of the method of improving the adhesion of an impermeable film onto a porous low-k dielectric film in an integrated circuit processing.

FIG. 2 is a flowchart showing the steps in the second embodiment of the method of improving the adhesion of an impermeable film onto a porous low-k dielectric film in an integrated circuit processing. Step 21 selects integrated circuit. Step 22 shows the current invention adhesion improvement process comprising three steps: step 24, step 26 and step 25. Step 24 provides the deposition of the porous low-k dielectric film. Then step 26 provides all other processes or a transfer process without exposing the porous low-k dielectric film to an atmosphere containing trappable organic molecules. Finally, step 25 provides the deposition of the impermeable film on top of the porous low-k dielectric film without exposing the porous low dielectric film to an atmosphere containing trappable organic molecules. Step 23 provides the rest of the integrated circuit processing such as interconnect and passivation. Step 26 is an optional step such as the deposition of a passivation or a cap layer on top of the porous low-k dielectric film, or the etching or patterning of the porous low-k dielectric film before the deposition of the impermeable film. Typically, the deposition of the porous low dielectric film and the deposition of the impermeable film are occurred in two separate processing chamber connected to a cluster system. Since a cluster system can have four to six process chambers, the other process chambers can be used for optional processes without exposing the porous low-k dielectric film to undesirable ambient.

Figure 3:
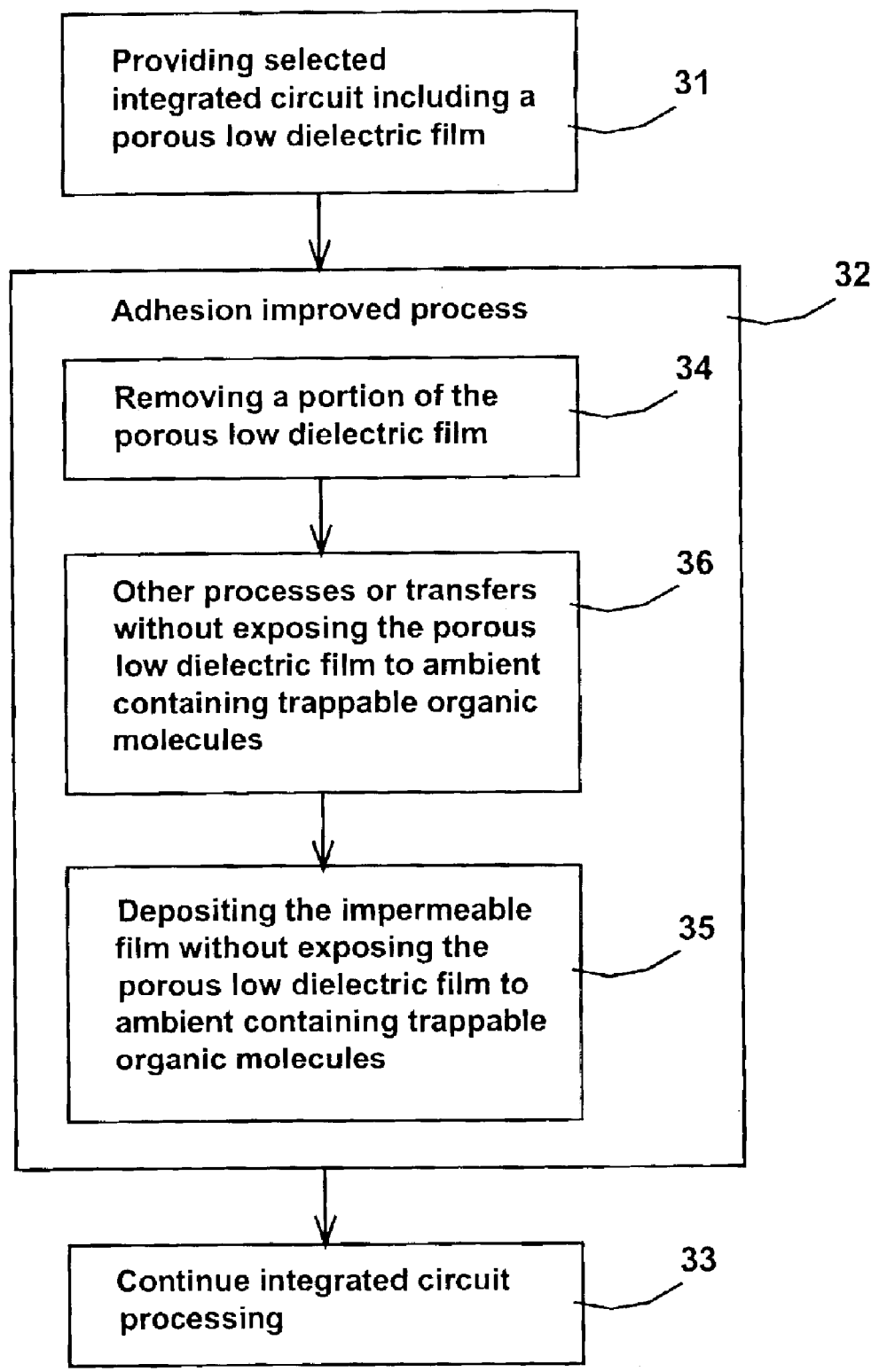
FIG. 3 is a flowchart showing the steps in the third embodiment of the method of improving the adhesion of an impermeable film onto a porous low-k dielectric film in an integrated circuit processing.

FIG. 3 is a flowchart showing the steps in the third embodiment of the method of improving the adhesion of an impermeable film onto a porous low dielectric film in an integrated circuit processing. Step 31 selects integrated circuit including a porous low-k dielectric film. Step 32 shows the current invention adhesion improvement process comprising three steps: step 34, step 36 and step 35. Step 34 provides the removal of a portion of the porous low-k dielectric film, typically by a plasma etch process. Then step 36 provides all other processes or a transfer process without exposing the porous low-k dielectric film to an atmosphere containing trappable organic molecules. Finally, step 35 provides the deposition of the impermeable film on top of the porous low k dielectric film without exposing the porous low dielectric film to an atmosphere containing trappable organic molecules. Step 33 provides the rest of the integrated circuit processing such as interconnect and passivation. Step 36 is an optional step such as the cleaning or photoresist stripping after the removal step 34 of a portion of the porous low-k dielectric film. The removal step 34 typically requires the use of a photoresist deposition for the pattern transfer, therefore step 36 provides an intermediate step of removing the residue photoresist, and the cleaning of the porous low-k dielectric film before the deposition of the impermeable film. Typically, the etching of the porous low-k dielectric film and the deposition of the impermeable film are occurred in two separate processing chamber connected to a cluster system. Since a cluster system can have four to six process chambers, the other process chambers can be used for optional processes such as resist stripping or cleaning or even annealing without exposing the porous low dielectric film to undesirable ambient.

Figure 4A:
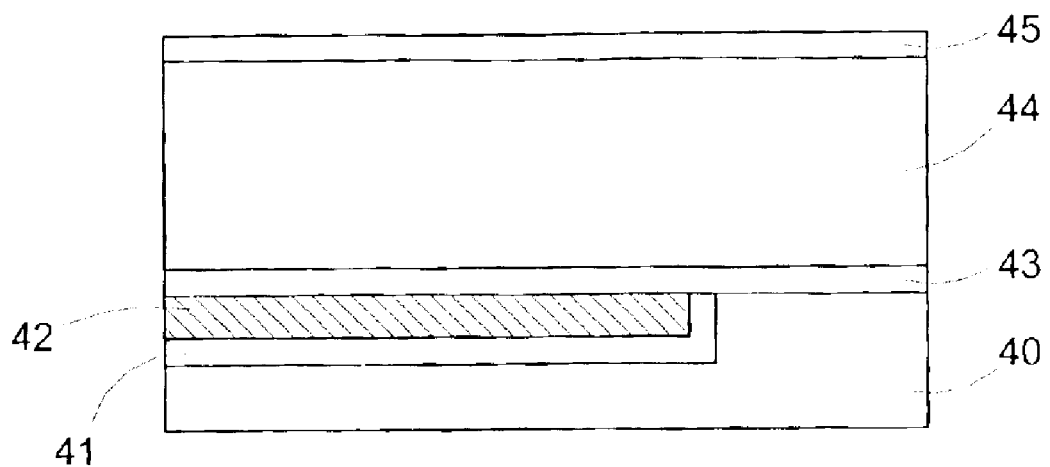
FIG. 4a–4f show the schematic of a typical integrated processing.

FIG. 4a through 4F show the schematic of a typical integrated processing incorporating the present invention. FIG. 4a shows a typical interconnect under layer. The under layer comprises a bottom dielectric layer 40 with a bottom conducting line 42 and a top dielectric layer 44. The bottom conducting layer 42 is covered by a diffusion barrier layer 41. Layer 43 is a top diffusion barrier for the bottom conducting layer 42 and also serves as an etch stop layer. Layer 45 is optional and serves as a cap layer or a passivation layer for the dielectric layer 44. The dielectric layers 40 and 44 can be porous low-k dielectric films to reduce the propagation delay.

Figure 4B:
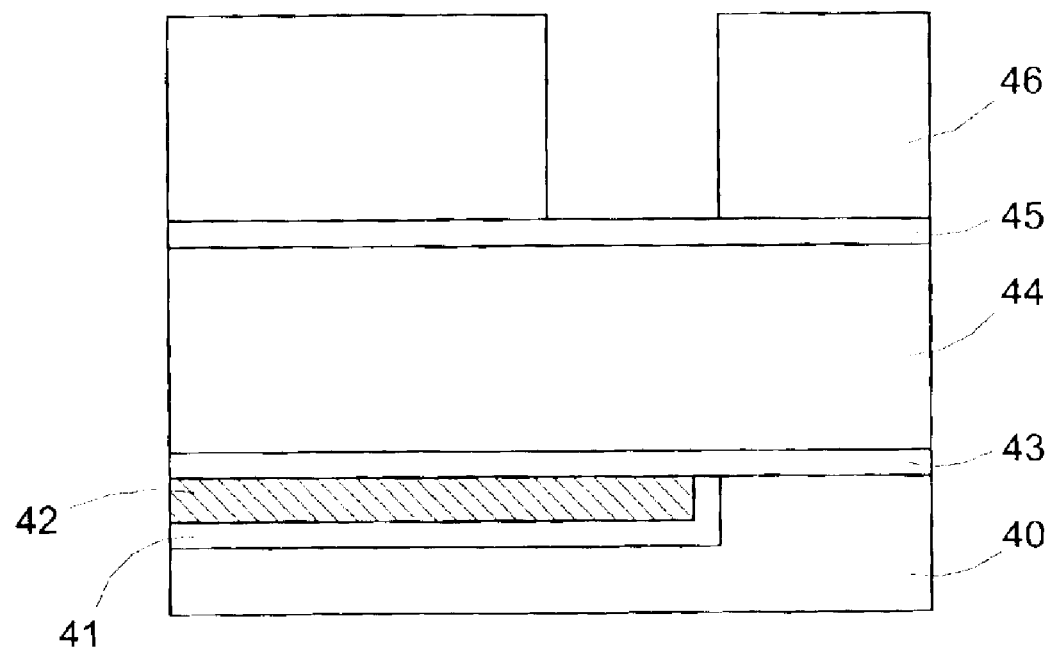

FIG. 4b shows the patterning step of the porous low-k dielectric film 44. A photoresist film 46 is coated on the cap layer 45 (or on the porous low dielectric film 44 if there is no cap layer 45). The photoresist is then exposed with a pattern mask and then the exposed photoresist is developed and removed. The photoresist now contains the pattern from the mask.

Figure 4C:
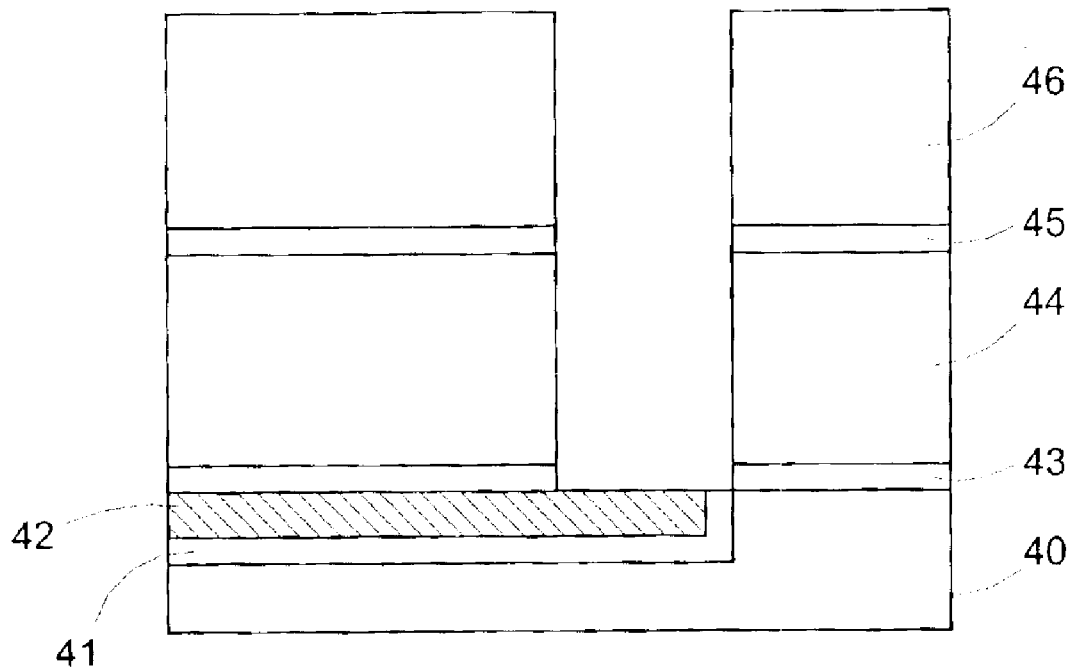

FIG. 4c shows the transfer of the photoresist pattern onto the porous low-k dielectric film by a plasma etch process. The photoresist protects the underlayer and the etch process only etches the exposed area as shown in FIG. 4c.

Figure 4D:
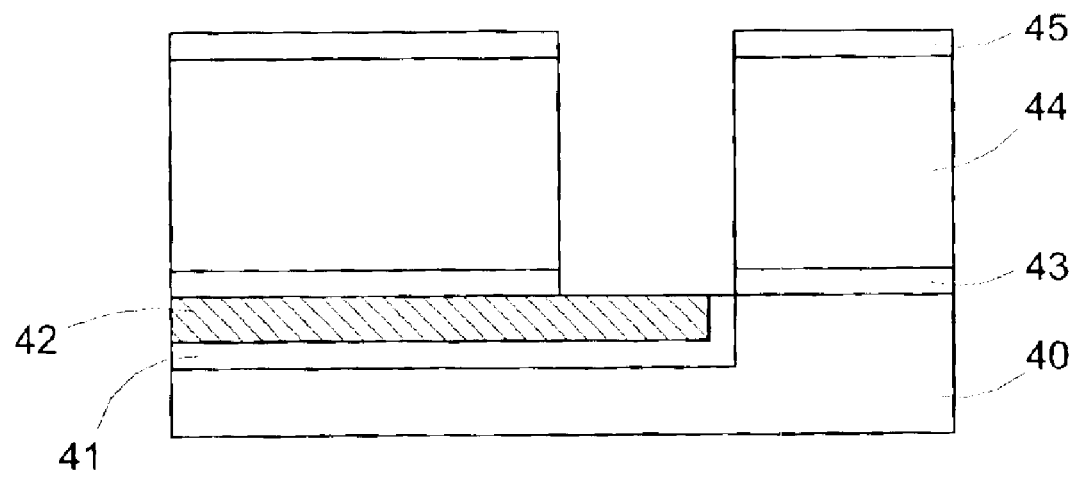

FIG. 4d shows the next step of removing the residue photoresist and cleaning of the porous low-k dielectric film 44.

Figure 4E:
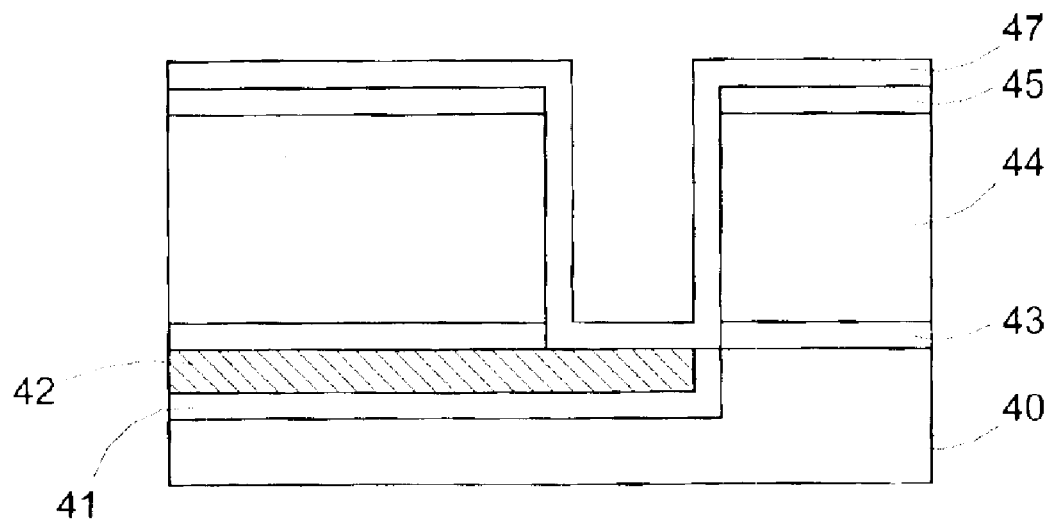
Figure 4F:
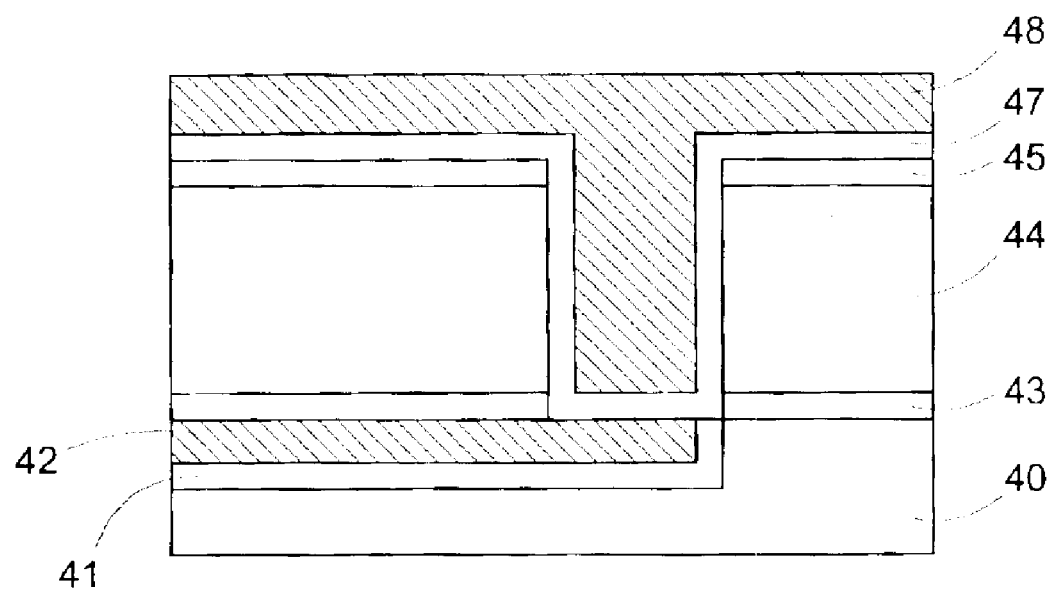

FIG. 4e shows the step of depositing an impermeable film 47 such as a diffusion barrier. And FIG. 4f shows the step of depositing the metal conduction line 48. Typical diffusion barriers for semiconductor interconnect are TiN, TiSiN, TaN, TaSiN WN and WSiN, for copper interconnect and aluminum interconnect.

What is claimed is:

1. A method to improve the adhesion of an impermeable film on a porous low-k dielectric film, the method comprising:

annealing the porous low dielectric film by heating the porous low dielectric film for a sufficient length of time to remove volatile molecules that are trapped inside the porous low-k dielectric film; and depositing an impermeable film on the porous low-k dielectric film without exposing the porous low-k dielectric fun to an atmosphere containing trappable molecules.

wherein the anneal process removes essentially all volatile molecules including organic material and moisture from the porous low-k dielectric film.

2. A method as in claim 1 wherein the porous material is selected from the group consisting of porous MSQ, porous HSQ, porous silica structures, low temperature deposited silicon carbon films, low temperature deposited Si—O—C films, and methyl doped porous silica.

3. A method as in claim 1 wherein the impermeable film is selected from the group consisting of TiN, TaN, WN, TiSiN, TaSiN, WSiN, $SiO_2$, $Si_3N_4$, metal films and Si films.

4. A method as in claim 1 wherein the deposition method to deposit the impermeable film is selected from the group consisting of a CVD, ALD, nanolayer deposition NLD, and sputtering techniques.

5. A method as in claim 1 wherein the porous low-k dielectric film has a protective layer on top.

6. A method as in claim 1 wherein the temperature of the anneal process is between 50° C. and 500° C.

7. A method as in claim 1 wherein the anneal time is between 10 seconds and 2 hours.

8. A method as in claim 1 wherein the anneal process is performed by resistive heater or radiative heater.

9. A method as in claims 1 wherein anneal ambient is selected from the group consisting of nitrogen, and inert gases.

10. A method as in claim 1 wherein the pressure of the anneal process is below atmospheric pressure.

11. A method as in claim 1 wherein the anneal step and the deposition step are performed in two separate chambers and the method further comprises an intermediate step of transferring the porous low-k dielectric film from an anneal chamber to a deposition chamber also without exposing the porous low-k dielectric film to an atmosphere containing trappable molecules.

12. A method as in claim 11 wherein the atmosphere not containing trappable molecules is a sub atmospheric pressure ambient.

13. A method as in claim 11 wherein the anneal chamber process is a batch process and the deposition process is a single process.

14. A method as in claim 1 wherein the porous low-k dielectric film has a protective layer on top.

15. The method as in claim 1 wherein the porous low dielectric film is in an integrated circuit.

* * * * *